United States Patent
Joo et al.

(10) Patent No.: US 7,038,958 B2
(45) Date of Patent: May 2, 2006

(54) DUAL STAGE DRAM MEMORY EQUALIZATION

(75) Inventors: Yangsung Joo, Boise, ID (US); David L. Pinney, Boise, ID (US); Jason Brown, Allen, TX (US)

(73) Assignee: Micron Technology, Inc., Boise, ID (US)

(*) Notice: Subject to any disclaimer, the term of this patent is extended or adjusted under 35 U.S.C. 154(b) by 34 days.

(21) Appl. No.: 10/926,357

(22) Filed: Aug. 26, 2004

(65) Prior Publication Data

US 2006/0044901 A1    Mar. 2, 2006

(51) Int. Cl.
*G11C 7/00*    (2006.01)
(52) U.S. Cl. ............... 365/203; 365/205; 365/190; 365/194
(58) Field of Classification Search ......... 365/203, 365/205, 190, 194
See application file for complete search history.

(56) References Cited

U.S. PATENT DOCUMENTS 5,646,900 A * 7/1997 Tsukude et al. ............ 365/205
5,881,005 A * 3/1999 Otori et al. ................. 365/205

\* cited by examiner

*Primary Examiner*—Van Thu Nguyen
*Assistant Examiner*—N Nguyen
(74) *Attorney, Agent, or Firm*—Dickstein Shapiro Morin & Oshinsky LLP (57) ABSTRACT

A memory device equilibrates voltages in a bit line pair to a reduced voltage level. The reduced equilibrate voltage level can be achieved by separating the conventional equilibrate process so that the positive portion and the negative portion of the sense amplifier are equilibrated at different times. Bit line equalization can be associated with either the equilibrate step associated with the positive portion of the sense amplifier or the equilibrate step associated with the negative portion of the sense amplifier.

26 Claims, 4 Drawing Sheets

DUAL STAGE DRAM MEMORY EQUALIZATION

FIELD OF INVENTION

The present invention relates generally to memory devices, and more particularly to a method and apparatus for operating the sense amplifiers in a memory device to equalize bit lines of the memory device.

BACKGROUND OF THE INVENTION

Figure 1:
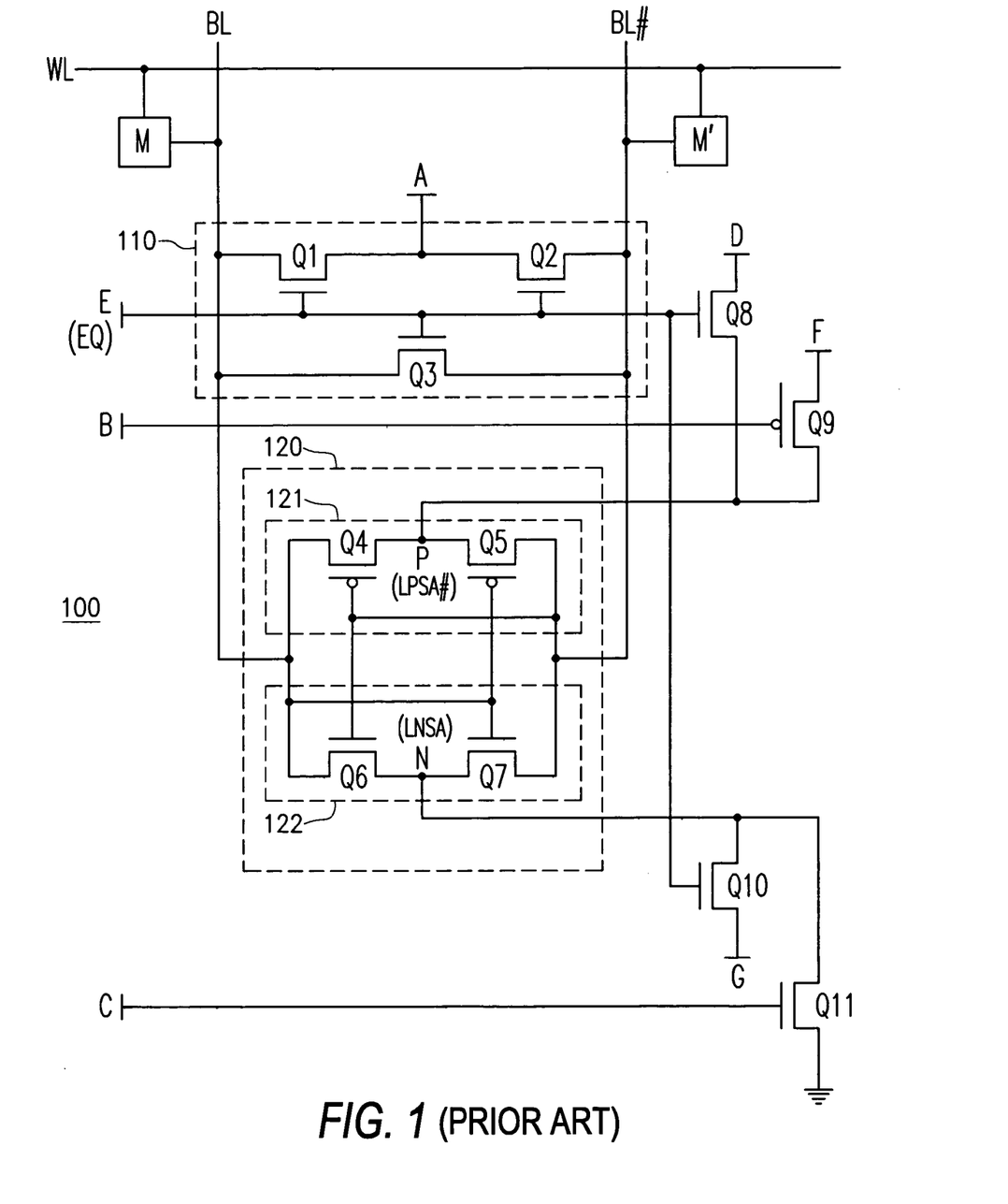
FIG. 1 is a circuit diagram of a conventional memory device.

FIG. 1 is a circuit diagram of a portion of a conventional memory device 100. The memory device 100 includes a plurality of memory cells M, M', which are respectively and controllably coupled to a plurality of bit lines BL, BL#. The memory cells M and M' are also coupled to a word line WL. Typically, a memory device 100 would have a large number of memory cells, and therefore a large number of bit lines and word lines, however, for simplicity, FIG. 1 only illustrates two memory cells M, M', two bit lines BL, BL#, and a single word line. Each memory cell M, M', might be, for example, a dynamic random access memory (DRAM) cell, such as a conventional one transistor one capacitor (1T1C) DRAM cell. In a memory device 100, each bit line BL is associated with another bit line such as bit line BL#. Each pair of associated bit lines BL, BL# is coupled to equalization circuitry 110 and sense amplifier 120. As illustrated, the equalization circuitry 110 comprises transistors Q1, Q2, and Q3 and the sense amplifier 120 comprises transistors Q4, Q5, Q6, and Q7.

The memory device 100 also includes transistors Q8, Q9, Q10, and Q11 and nodes A, B, C, D, E, F, G, N, and P, which are used to control the operation of the equalization circuitry 110 and the sense amplifier 120. The memory device 100 also includes additional control circuitry, which is not illustrated in order to avoid cluttering the figure. Nodes A, D, F, and G, are preferably coupled to a source of a predetermined voltage (e.g., dvc2), while nodes E, B, and C are coupled to control signals as described below. As used in the application, the dvc2 voltage refers to a voltage level at half the level of the D.C. supply voltage.

The sense amplifier 120 is comprised of a positive portion 121 and a negative portion 122. Each portion 121, 122 includes a common node. In the positive portion 121 the common node is node P, while in the negative portion 122 the common node is node N. Control signals are supplied to the common nodes P, N as described below to operate the portions 121, 122 of the sense amplifier 120.

Figure 3:
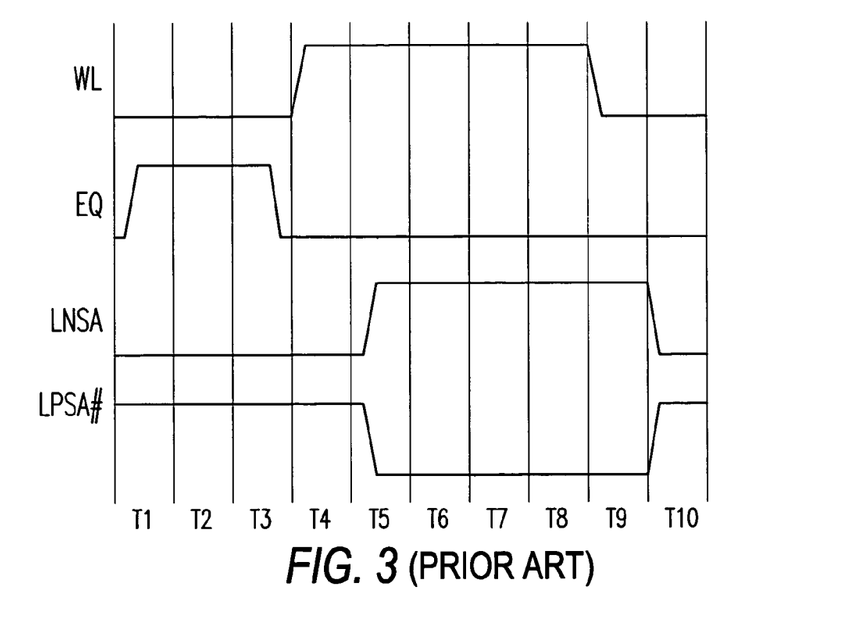
FIG. 3 is a timing diagram depicting the operation of the memory device of FIG. 1.

Now also referring to the timing diagram of FIG. 3, a read operation of memory cell M is explained. The timing diagram of FIG. 3 is divided into ten equal length time periods T1–T10. Each time period may correspond, for example, to a clock cycle in a synchronous DRAM (SDRAM) device, or a half clock cycle in a double data rate SDRAM device.

At time period T1, the word line is set to a low state, bit line BL has been set to a high state and associated bit line BL# has been set to a low state (not shown). Control signal LNSA, which is supplied from node C, is set to a low state, causing transistor Q11 to be non conducting. Control signal LPSA#, which is supplied from node B, is set to a high state, causing transistor Q9 to be non conducting. Additionally, control signal EQ, which is supplied from node E, transitions from low to high.

As a result, by time period T2, transistors Q1, Q2, Q3, Q8, and Q10 begin to conduct. Transistors Q1, Q2, and Q3 operate to equalize the voltage on bit line BL associated with memory cell M and its associated bit line BL# to a same predetermined voltage, such as dvc2. Transistor Q8 conducts and sets the voltage at node P to the same voltage as node D, which as previously described is dvc2. Transistor Q10 conducts, thereby setting node N to have the same voltage as node G (i.e., dvc2).

At time period T3, control signal EQ transitions low, causing transistors Q1, Q2, Q3, Q8, and Q10 to become non conducting, and thereby causing bit lines BL, BL# and nodes P, N to float at a voltage of dvc2. This step of equalizing the voltages on bit lines BL, BL# and nodes P, N is known as an equilibrate step. As described above, the bit lines BL, BL# and nodes P, N are equilibrated to a common voltage at a common time.

At time period T4, the world line WL associated with the memory cell M is set to a high level (e.g., Vpp). The memory cell M is then coupled to its bit line BL, thereby causing the memory cell M to share its charge with the bit line BL. As a result, the voltage of bit line BL is altered. The polarity of the alternation in the voltage of bit line BL is dependent on the charge stored in the memory cell M. Bit line BL will therefore either have a higher or a lower voltage than its associated bit line BL#.

At time period T5, control signal LNSA, which is supplied from node C, transitions from low to high, and control signal LPSA#, which is supplied from node B transitions from high to low. Controls signals LNSA and LPSA# are control signals for determining when the negative 122 and positive 121 portions of the sense amplifier 120 are activated. More specifically, when control signal LNSA is high, the negative portion 122 of the sense amplifier 120, comprising transistors Q6 and Q7, is activated, and pulls the bit line having the lower voltage in the bit line pair BL, BL# to ground. When control signal LPSA# is low, the positive portion 121 of the sense amplifier 120, comprising transistors Q4, Q5, is activated and pulls the bit line having the higher potential in the bit line pair BL, BL# to a high potential. The pulling of voltages on bit lines BL, BL# occurs during time periods T5, T6, T7, and T8 and is completed by the end of time period T8.

Thus, by time period T9, the bit line of the bit line pair BL, BL# having higher potential is pulled high while the bit line of the bit line pair BL, BL# having lower potential is pulled to ground (i.e., low). In time period T9, the word line WL is also reset to its low logical state. In time period T10, control signals LNSA and LPSA# return to their original states.

It is advantageous to equilibrate a bit line pair BL, BL# to a voltage level less than dvc2. Conventionally, a lower equilibrate voltage can be achieved by bleeding voltage off the bit line pair BL, BL# after equilibrating the bit lines to dvc2. However, this method requires significant current handling within the memory device and is difficult to perform for high speed memory devices. Accordingly, there is a need and desire for a memory device and associated method for equilibrating a bit line pair to a reduced voltage than the level typically used.

SUMMARY OF THE INVENTION

The present invention is directed to equilibrating voltages in a bit line pair to a reduced voltage level than the level typically used. In exemplary embodiments of the invention, the reduced equilibrate voltage level can be achieved by separating the conventional equilibrate process so that the positive portion and the negative portion of a sense amplifier are equilibrated at different times. Bit line equilibration can be associated with either the equilibrate step associated with the positive portion of the sense amplifier or the equilibrate step associated with the negative portion of the sense amplifier.

BRIEF DESCRIPTION OF THE DRAWINGS

The foregoing and other advantages and features of the invention will become more apparent from the detailed description of exemplary embodiments of the invention given below with reference to the accompanying drawings, in which.

DETAILED DESCRIPTION OF THE INVENTION

Figure 2:
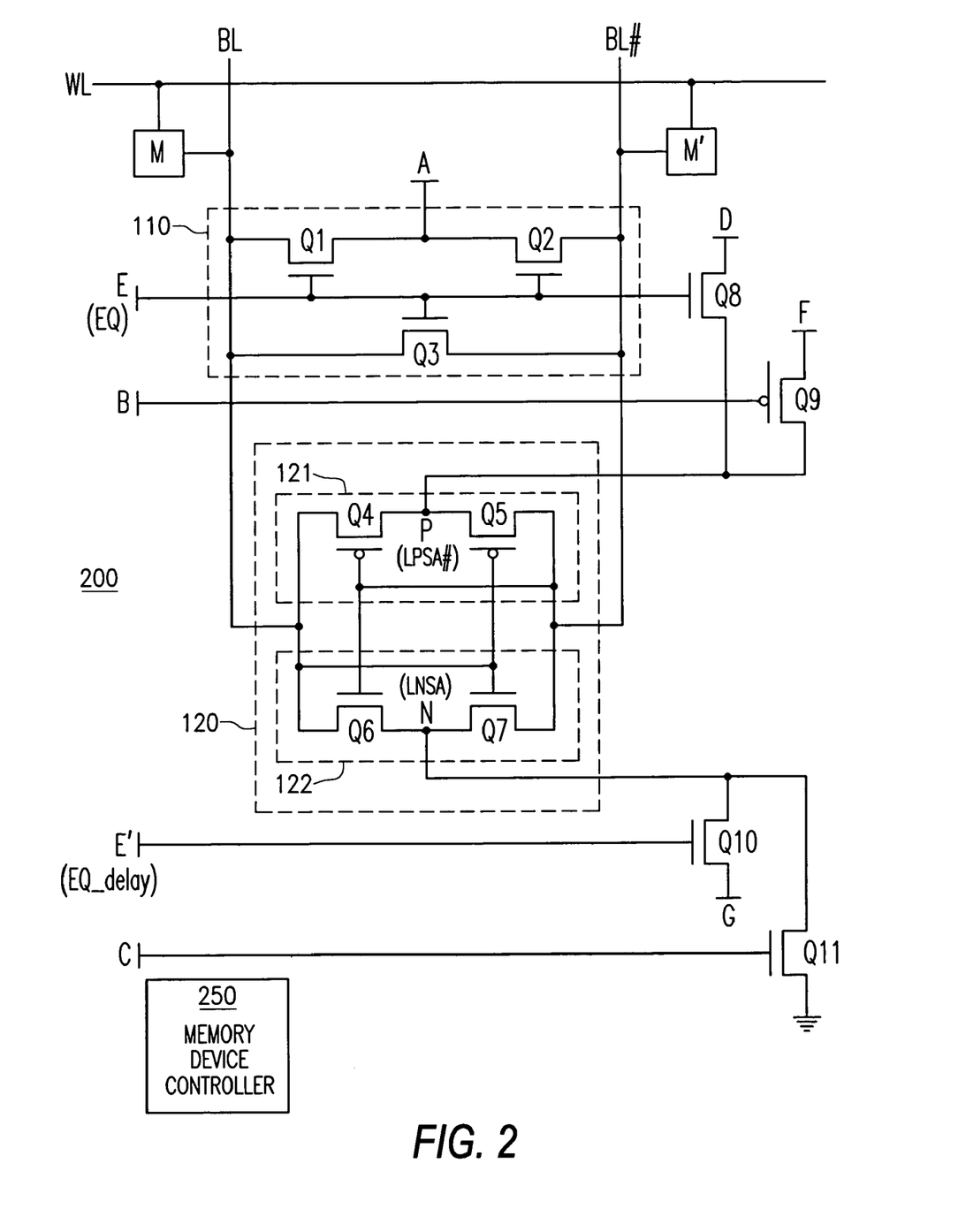
FIG. 2 is a circuit diagram of a memory device in accordance with one embodiment of the present invention.

Now referring to the drawings, where like reference numerals designate like elements, there is shown in FIG. 2 a circuit diagram of a portion of a memory device in accordance with one exemplary embodiment of the present invention. The memory device 200 has numerous components found in the conventional memory device 100 (FIG. 1), including, a plurality of memory cells M, M', which are respectively and controllably coupled to a plurality of bit lines BL, BL#. The memory cells M and M' are also coupled to a word line WL. Typically, the memory device 200 would have a large number of memory cells, and therefore a large number of bit lines and word lines, however, for simplicity, FIG. 2 only illustrates a portion of the memory device comprising two memory cells M, M', two bit lines BL, BL#, and a single word line. The memory cells M, M' may be any type of dynamic random access memory (DRAM) cell, such as the well known "1T1C" DRAM cell, however, the principles of the present invention are applicable to other types of memory cell architectures. The term DRAM should be widely construed and is intended to cover any type of dynamic random access memory, for example, asynchronous DRAM, synchronous DRAM, double data rate DRAM, SLDRAM, etc. In the memory device 200, each bit line BL is associated with another bit line such as BL#. Each pair of associated bit lines BL, BL# is coupled to the equalization circuitry 110 and sense amplifier 120. As illustrated, the equalization circuitry 110 comprises transistors Q1, Q2, and Q3 and the sense amplifier 120 comprises transistors Q4, Q5, Q6, and Q7.

The memory device 200 also includes transistors Q8, Q9, Q10, and Q11 and nodes A, B, C, D, E, E', F, G, N, and P, which are used to control the operation of the equalization circuitry 110 and the sense amplifier 120. The memory device 200 also includes additional control circuitry, which is not illustrated in order to avoid cluttering the figure. Nodes A, D, F, and G, are preferably coupled to sources of a predetermined voltage. In one exemplary embodiment, nodes A, D, F, and G are coupled to voltage sources that provide the dvc2 voltage. Nodes E, E', B, and C are coupled to control signals as described below. The control signals can be generated by control circuitry, such as a memory device controller 250.

Figure 4:
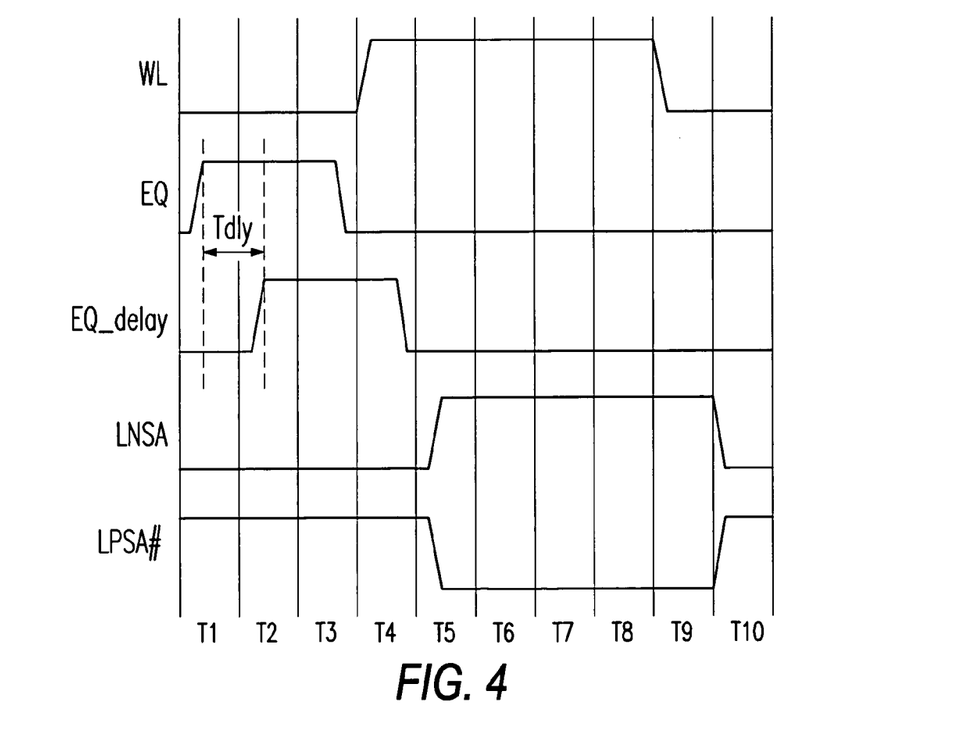
FIG. 4 is a timing diagram depicting the operation of the memory device of FIG. 2.

Now also referring to the timing diagram of FIG. 4, a read operation of memory cell M is explained. As illustrated, the timing diagram of FIG. 4 is divided into ten equal length time periods T1–T10. Each time period may correspond, for example, to a clock cycle in a synchronous DRAM (SDRAM) device, or a half clock cycle in a double data rate SDRAM device. It should be noted that the invention may be practiced without strictly complying with the time sequence illustrated in FIG. 4. For example, in an asynchronous device, the time periods may not necessarily be equally sized. Additionally, memory devices operate at a variety of speeds and components internal to different memory devices have varying speeds. Thus, some memory devices may require less than 10 time periods to perform the below described operation, while other memory devices may require more than 10 time periods. Moreover, using control signal LNSA as an example, FIG. 4 illustrates the signal in a high logical state for at least 4 complete time periods. In memory devices with faster internal components, the LNSA signal may be held high for less than 4 complete time periods. In general, the invention may be practiced using varying timing arrangements as long as the relative timing relationships between the control signals are preserved.

At time period T1, the word line WL is set to a low state, bit line BL has been set to a high state and associated bit line BL# has been set to a low state (not shown). Control signal LNSA, which is supplied from node C, is set to a low state, causing transistor Q11 to be non conducting. Control signal LPSA#, which is supplied from node B, is set to a high state, causing transistor Q9 to be non conducting. Additionally, control signal EQ, which is supplied from node E, transitions from low to high. (Alternatively, control signal LNSA from node C can delay it being set to a low logical state until a short time after control signal EQ from node E transitions to a low logical state.) A new control signal, EQ_delay, supplied from node E' is at a low state. As will become readily apparent, the new control signal, EQ_delay, is a delayed version of the EQ signal. Thus, the EQ_delay signal can be generated by the memory device controller 250 as a separate control signal, or it can be generated by tapping a signal line having the EQ signal and passing that signal through delay device. Control signal EQ_delay is hereinafter referred to as the "delayed EQ control signal".

As a result, by time period T2, transistors Q1, Q2, and Q3 begin to conduct. Transistors Q1, Q2, and Q3 operate to equalize the voltage on bit line BL associated with memory cell M and its associated bit line BL#. Since bit line BL was set to a high state and bit line BL# was set to a low state, the conduction of transistor Q3 will cause both bit lines BL, BL# to take a voltage mid-point between the high and low states, i.e., the dvc2 voltage. Additionally, the same dvc2 voltage is also supplied to both bit lines BL, BL# from node A, via the conduction of transistor Q1 (to bit line BL) and transistor Q2 (to bit line BL#).

Transistor Q8 also conducts and sets the voltage at node P to the same voltage as node D, which in one exemplary embodiment is ground potential or a voltage lower than dvc2. Transistors Q10 and Q11 are both non conducting, and therefore the voltage at node N is permitted to float. Since bit line BL is initially higher in voltage than bit line BL#, transistors Q5 and Q6 will be non conducting while transistors Q4 and Q7 will be conducting. The conduction of transistor Q4 causes the bit line BL to drop in voltage while the conduction of transistor Q7 causes bit line BL# to increase in voltage. However, capacitance associated with transistor Q7 will cause bit line BL to drop in voltage at a faster rate than the rate the associated bit line BL# is rising in voltage. In this manner, the equilibrated voltage, which is the average voltage of bit lines BL and BL# due to the conduction of transistor Q3, which couples both bit lines BL, BL#, will be somewhat less than the dvc2 voltage. In one exemplary embodiment, the dvc2 voltage is approximately 750 mV and the equilibrated voltage is reduced to approximately 25 mV below the dvc2 voltage.

Also during time period T2, the delayed EQ control signal EQ_delay, supplied from node E', transitions high. Thus, by time period T3, transistor Q10 begins to conduct and sets the voltage at node N to the same voltage as node G, which in one exemplary embodiment is dvc2.

At time period T3, control signal EQ transitions low, and at time period T4, control signal EQ_delay also transitions low. As a result, by time period T4, transistors Q1, Q2, Q3, Q8, and Q10 are non conducting and bit lines BL, BL# float at a voltage somewhat less than dvc2, while nodes P, N float at a voltage of dvc2. Thus, in the present invention, the positive and negative portions 121, 122 of the sense amplifier 120 are equilibrated at different times.

Also during time period T4, the word line WL associated with the memory cell M is set to a high level (e.g., Vpp). The memory cell M is then coupled to its bit line BL, thereby causing the memory cell M to share its charge with the bit line. As a result, the voltage of bit line BL is altered. The polarity of the alternation in the voltage of bit line BL is dependent on the charge stored in the memory cell M. Bit line BL will therefore either have a higher or a lower voltage than associated bit line BL#.

At time period T5, control signal LNSA, which is supplied from node C, transitions from low to high, and control signal LPSA#, which is supplied from node B transitions from high to low. Controls signals LNSA and LPSA# are control signals for determining when the negative 121 and positive 122 portions of the sense amplifier 120 are activated. More specifically, when control signal LNSA is high, the negative portion 122 of the sense amplifier 120, comprising transistors Q6 and Q7, is activated, and pulls the bit line having the lower voltage in a bit line pair BL, BL# to ground. When control signal LPSA# is low, the positive portion 121 of the sense amplifier 120, comprising transistors Q4, Q5, is activated and pulls the bit line having the higher potential in a bit line pair BL, BL# to a high voltage level. The pulling of voltages on bit lines BL, BL# occurs during time periods T5, T6, T7, and T8 and is completed by the end of time period T8.

Thus, by time period T9, the bit line of the bit line pair BL, BL# having higher potential is pulled high while the bit line of the bit line pair BL, BL# having lower potential is pulled low. In time period T9, the word line WL is also reset to its low logical state. In time period T10, control signals LNSA and LPSA# return to their original states.

Figure 5:
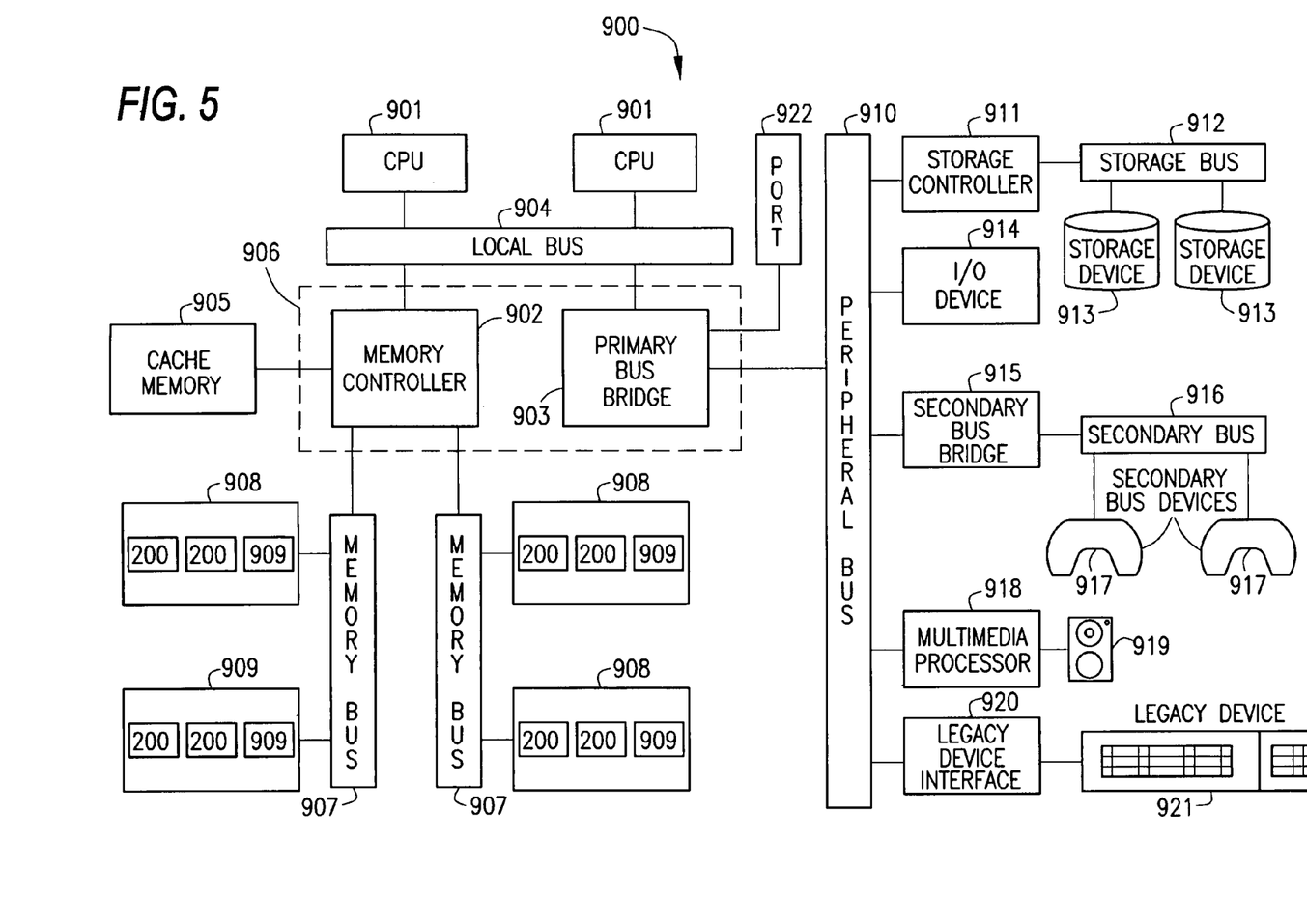
FIG. 5 is a block diagram illustrating how the memory device of FIG. 2 can be used in a computer system.

FIG. 5 illustrates an exemplary processing system 900 which may utilize the memory device 200 of the present invention. The processing system 900 includes one or more processors 901 coupled to a local bus 904. A memory controller 902 and a primary bus bridge 903 are also coupled the local bus 904. The processing system 900 may include multiple memory controllers 902 and/or multiple primary bus bridges 903. The memory controller 902 and the primary bus bridge 903 may be integrated as a single device 906.

The memory controller 902 is also coupled to one or more memory buses 907. Each memory bus accepts memory components 908 which include at least one memory device 200 of the present invention. The memory components 908 may be a memory card or a memory module. Examples of memory modules include single inline memory modules (SIMMs) and dual inline memory modules (DIMMs). The memory components 908 may include one or more additional devices 909. For example, in a SIMM or DIMM, the additional device 909 might be a configuration memory, such as a serial presence detect (SPD) memory. The memory controller 902 may also be coupled to a cache memory 905. The cache memory 905 may be the only cache memory in the processing system. Alternatively, other devices, for example, processors 901 may also include cache memories, which may form a cache hierarchy with cache memory 905. If the processing system 900 include peripherals or controllers which are bus masters or which support direct memory access (DMA), the memory controller 902 may implement a cache coherency protocol. If the memory controller 902 is coupled to a plurality of memory buses 907, each memory bus 907 may be operated in parallel, or different address ranges may be mapped to different memory buses 907.

The primary bus bridge 903 is coupled to at least one peripheral bus 910. Various devices, such as peripherals or additional bus bridges may be coupled to the peripheral bus 910. These devices may include a storage controller 911, a miscellaneous I/O device 914, a secondary bus bridge 915 communicating with a secondary bus 916, a multimedia processor 918, and a legacy device interface 920. The primary bus bridge 903 may also coupled to one or more special purpose high speed ports 922. In a personal computer, for example, the special purpose port might be the Accelerated Graphics Port (AGP), used to couple a high performance video card to the processing system 900.

The storage controller 911 couples one or more storage devices 913, via a storage bus 912, to the peripheral bus 910. For example, the storage controller 911 may be a SCSI controller and storage devices 913 may be SCSI discs. The I/O device 914 may be any sort of peripheral. For example, the I/O device 914 may be an local area network interface, such as an Ethernet card. The secondary bus bridge 915 may be used to interface additional devices via another bus to the processing system. For example, the secondary bus bridge may be a universal serial port (USB) controller used to couple USB devices 917 via a secondary bus 916 and the secondary bus bridge 915 to the processing system 900. The multimedia processor 918 may be a sound card, a video capture card, or any other type of media interface, which may also be coupled to one or more additional devices such as speakers 919. The legacy device interface 920 is used to couple at least one legacy device 921, for example, older style keyboards and mice, to the processing system 900.

The processing system 900 illustrated in FIG. 5 is only an exemplary processing system with which the invention may be used. While FIG. 5 illustrates a processing architecture especially suitable for a general purpose computer, such as a personal computer or a workstation, it should be recognized that modifications can be made to configure the processing system 900 to become more suitable for use in a variety of applications. For example, many electronic devices which require processing may be implemented using a simpler architecture which relies on a CPU 901 coupled to memory components 908 and/or memory devices 200. These electronic devices may include, but are not limited to audio/video processors and recorders, gaming consoles, digital television sets, wired or wireless telephones, navigation devices (including system based on the global positioning system (GPS) and/or inertial navigation), and digital cameras and/or recorders. The modifications may include, for example, elimination of unnecessary components, addition of specialized devices or circuits, and/or integration of a plurality of devices.

The present invention therefore permits the bit lines of a memory device to be equilibrated at a voltage lower than the typical dvc2 while retaining the ordinary power supply components of a memory device, such as a source of dvc2 voltage. In the present invention, the equilibration of the sense amplifier is bifurcated. In the above described embodiment, the positive portion of the sense amplifier and the bit lines are initially equilibrated, followed by equilibrating the negative portion of the sense amplifier. Alternatively, the present invention may also be implemented by equilibrating the bit lines with the negative portion of the sense amplifier. Finally, the present invention may also be implemented by equilibrating a first bit line to a ground potential and another bit line paired the first bit line to a sense amplifier to a higher potential (e.g., Vcc or dvc2) and, at a second time subsequent to the first time, coupling the pair of bit lines. A difference in the rate of equilibration between the positive and negative portions of the sense amplifier (i.e., the positive portion of the sense amplifier pulls potential down faster than the negative portion pulls potential up) results in a reduced equilibration level.

While the invention has been described in detail in connection with exemplary embodiments, it should be understood that the invention is not limited to the above disclosed embodiments. Rather, the invention can be modified to incorporate any number of variations, alternations, substitutions, or equivalent arrangements not heretofore described, but which are commensurate with the spirit and scope of the invention. Accordingly, the invention is not limited by the foregoing description or drawings, but is only limited by the scope of the appended claims.

What is claimed as new and desired to be protected by Letters Patent of the United States is:

1. A method for equilibrating a first bit line with a second bit line in a memory device, comprising:
   setting said first bit line to a first potential;
   setting said second bit line to a second potential;
   at a first time,
      applying a first control signal to a first common node of a sense amplifier to equilibrate a negative portion of said sense amplifier, said sense amplifier being coupled to said first and second bit lines,
      coupling said first bit line to said second bit line, and
      coupling said first and second bit lines to a third potential equal to an average of said first potential and said second potential;
   at a second time, different than said first time,
      applying a second control signal to a second common node of said sense amplifier to equilibrate a positive portion of said sense amplifier.

2. The method of claim 1, wherein one of said first potential and said second potential is a DC supply voltage, another of said first potential and said second potential is a ground potential.

3. The method of claim 1, further comprising:
   delaying a copy of said first control signal to produce said second control signal.

4. A method for equilibrating a first bit line with a second bit line in a memory device, comprising:
   setting said first bit line to a first potential;
   setting said second bit line to a second potential;
   at a first time,
      applying a first control signal to a first common node of a sense amplifier to equilibrate a positive portion of said sense amplifier, said sense amplifier being coupled to said first and second bit lines; and
   at a second time, different than said first time,
      applying a second control signal to a second common node of said sense amplifier to equilibrate a negative portion of said sense amplifier,
      coupling said first bit line to said second bit line, and
      coupling said first and second bit line to a third potential equal to an average of said first potential and said second potential.

5. The method of claim 1, wherein one of said first potential and said second potential is a DC supply voltage, another of said first potential and said second potential is a ground potential.

6. The method of claim 1, further comprising:
   delaying a copy of said first control signal to produce said second control signal.

7. A memory device, comprising:
   a control circuit;
   a plurality of bit lines, organized into a plurality of pairs of associated bit lines;
   a plurality of word lines;
   a plurality of memory cells, each memory cell being coupled to one of said plurality of bit lines and one of said plurality of word lines; and
   a plurality of sense amplifiers, each sense amplifier being coupled to said control circuit and to a respective pair of associated bit lines, each sense amplifier having a negative portion with a first common node and a positive portion with a second common node,
   wherein said control circuit performs an equilibrate operation on one pair of associated bit lines by
      at a first time,
         applying a first control signal to the first common node to equilibrate the negative portion of the sense amplifier coupled to said one pair of associated bit lines, and
         coupling said associated pair of bit lines with each other and with a source of a third potential equal to an average of said first potential and said second potential; and
      at a second time subsequent to said first time,
         applying a second control signal to the second common node to equilibrate the positive portion of the second portion of the sense amplifier coupled to said one pair of associated bit lines.

8. The memory device of claim 7, wherein one of said first potential and said second potential is a DC supply voltage, another of said first potential and said second potential is a ground potential.

9. The memory device of claim 7, wherein said control circuit comprises a delay device that delays a copy of said first control signal to produce said second control signal.

10. A memory device, comprising:
    a control circuit;
    a plurality of bit lines, organized into a plurality of pairs of associated bit lines;
    a plurality of word lines;
    a plurality of memory cells, each memory cell being coupled to one of said plurality of bit lines and one of said plurality of word lines; and
    a plurality of sense amplifiers, each sense amplifier being coupled to said control circuit and to a respective pair of associated bit lines, each sense amplifier having a positive portion with a first common node and a negative portion with a second common node,
    wherein said control circuit performs an equilibrate operation on one pair of associated bit lines by
       at a first time, applying a first control signal to the first common node to equilibrate the positive portion of the sense amplifier coupled to said one pair of associated bit lines; and at a second time subsequent to said first time, applying a second control signal to the second common node to equilibrate the negative portion of the second portion of the sense amplifier coupled to said one pair of associated bit lines, and coupling said associated pair of bit lines with each other and with a source of a third potential equal to an average of said first potential and said second potential.

11. The memory device of claim 10, wherein one of said first potential and said second potential is a DC supply voltage, another of said first potential and said second potential is a ground potential.

12. The memory device of claim 10, wherein said control circuit comprises a delay device that delays a copy of said first control signal to produce said second control signal.

13. A system, comprising:
a bus;
a processor, coupled to said bus; and
a memory, coupled to said bus, said memory further comprising:
a control circuit;
a plurality of bit lines, organized into a plurality of pairs of associated bit lines;
a plurality of word lines;
a plurality of memory cells, each memory cell being coupled to one of said plurality of bit lines and one of said plurality of word lines; and
a plurality of sense amplifiers, each sense amplifier being coupled to said control circuit and to a respective pair of associated bit lines, each sense amplifier having a negative portion with a first common node and a positive portion with a second common node,
wherein said control circuit performs an equilibrate operation on one pair of associated bit lines by
at a first time,
applying a first control signal to the first common node to equilibrate the negative portion of the sense amplifier coupled to said one pair of associated bit lines, and
coupling said associated pair of bit lines with each other and with a source of a third potential equal to an average of said first potential and said second potential; and
at a second time subsequent to said first time,
applying a second control signal to the second common node to equilibrate the positive portion of the second portion of the sense amplifier coupled to said one pair of associated bit lines.

14. A system, comprising:
a bus;
a processor, coupled to said bus; and
a memory, coupled to said bus, said memory further comprising:
a control circuit;
a plurality of bit lines, organized into a plurality of pairs of associated bit lines;
a plurality of word lines;
a plurality of memory cells, each memory cell being coupled to one of said plurality of bit lines and one of said plurality of word lines; and
a plurality of sense amplifiers, each sense amplifier being coupled to said control circuit and to a respective pair of associated bit lines, each sense amplifier having a positive portion with a first common node and a negative portion with a second common node,
wherein said control circuit performs an equilibrate operation on one pair of associated bit lines by
at a first time,
applying a first control signal to the first common node to equilibrate the positive portion of the sense amplifier coupled to said one pair of associated bit lines; and
at a second time subsequent to said first time,
applying a second control signal to the second common node to equilibrate the negative portion of the second portion of the sense amplifier coupled to said one pair of associated bit lines, and
coupling said associated pair of bit lines with each other and with a source of a third potential equal to an average of said first potential and said second potential.

15. A method for equilibrating a first bit line and a second bit line coupled to a sense amplifier, comprising:
setting said first bit line to a first potential;
setting said second bit line to a second potential;
coupling an equilibrate control signal to a first common node of said sense amplifier to equilibrate a negative portion of said sense amplifier while coupling said first and second bit lines to a third potential equal to an average of said first and second potential; and
coupling a delayed equilibrate control signal, generated by delaying the equilibrate control signal, to a second common node of said sense amplifier to equilibrate a positive portion of said sense amplifier.

16. The method of claim 15, wherein one of said first potential and said second potential is a DC supply voltage, and another of said first potential and said second potential is a ground potential.

17. A method for equilibrating a first bit line and a second bit line coupled to a sense amplifier, comprising:
setting said first bit line to a first potential;
setting said second bit line to a second potential;
coupling an equilibrate control signal to a first common node of said sense amplifier to equilibrate a positive portion of said sense amplifier; and
coupling a delayed equilibrate control signal, generated by delaying the equilibrate control signal, to a second common node of said sense amplifier to equilibrate a negative portion of said sense amplifier while coupling said first and second bit lines to a third potential equal to an average of said first and second potential.

18. The method of claim 17, wherein one of said first potential and said second potential is a DC supply voltage, and another of said first potential and said second potential is a ground potential.

19. A memory device, comprising:
a control circuit for generating a first control signal;
a delay device for generating a second control signal by delaying said first control signal;
a plurality of bit lines, organized into a plurality of pairs of associated bit lines;
a plurality of word lines;
a plurality of memory cells, each memory cell being coupled to one of said plurality of bit lines and one of said plurality of word lines; and
a plurality of sense amplifiers, each sense amplifier being coupled to said control circuit and to a respective pair of associated bit lines, each sense amplifier having a negative portion with a first common node and a positive portion with a second common node, wherein said control circuit performs an equilibrate operation on one pair of associated bit lines by applying the first control signal to the first common node to equilibrate the negative portion of the sense amplifier coupled to said one pair of associated bit lines, while coupling said associated pair of bit lines with each other and with a source of a third potential equal to an average of said first potential and said second potential, and applying the second control signal to the second common node to equilibrate the positive portion of the second portion of the sense amplifier coupled to said one pair of associated bit lines.

20. A memory device, comprising:

a control circuit;

a delay device for generating a second control signal by delaying said first control signal;

a plurality of bit lines, organized into a plurality of pairs of associated bit lines;

a plurality of word lines;

a plurality of memory cells, each memory cell being coupled to one of said plurality of bit lines and one of said plurality of word lines; and a plurality of sense amplifiers, each sense amplifier being coupled to said control circuit and to a respective pair of associated bit lines, each sense amplifier having a positive portion with a first common node and a negative portion with a second common node, wherein said control circuit performs an equilibrate operation on one pair of associated bit lines by applying the first control signal to the first common node to equilibrate the positive portion of the sense amplifier coupled to said one pair of associated bit lines; and applying the second control signal to the second common node to equilibrate the negative portion of the second portion of the sense amplifier coupled to said one pair of associated bit lines, and coupling said associated pair of bit lines with each other and with a source of a third potential equal to an average of said first potential and said second potential.

21. A memory, comprising:

a control circuit;

a plurality of bit lines, organized into a plurality of pairs of associated bit lines;

a plurality of word lines;

a plurality of memory cells, each memory cell being coupled to one of said plurality of bit lines and one of said plurality of word lines; and a plurality of sense amplifiers, each sense amplifier being coupled to said control circuit and to a respective pair of associated bit lines, each sense amplifier having a positive portion with a first common node and a negative portion with a second common node, wherein said control circuit performs an equilibrate operation on one pair of associated bit lines by at a first time, applying a first control signal to the first common node to equilibrate the positive portion of the sense amplifier coupled to said one pair of associated bit lines to a first potential; and applying a second control signal to the second common node to equilibrate the negative portion of the sense amplifier coupled to said one pair of associated bit lines to a second potential;

at a second time subsequent to said first time, coupling said associated pair of bit lines with each other.

22. The memory of claim 21, wherein said first potential and said second potential are chosen from a group consisting of a ground potential and a DC power supply voltage.

23. The memory of claim 21, wherein said first potential and said second potential are chosen from a group consisting of a ground potential and a half DC power supply voltage.

24. A method for equilibrating a first bit line and a second bit line coupled to a sense amplifier, comprising:

at a first time, equilibrating the first bit line to a first potential using a positive portion of the sense amplifier; and equilibrating the second bit line to a second potential using a negative portion of the sense amplifier; and at a second time, subsequent to the first time, coupling said first bit line with said second bit line.

25. The method of claim 24, wherein said first potential and said second potential are chosen from a group consisting of a ground potential and a DC power supply voltage.

26. The method of claim 24, wherein said first potential and said second potential are chosen from a group consisting of a ground potential and a half DC power supply voltage.

* * * * *

UNITED STATES PATENT AND TRADEMARK OFFICE
CERTIFICATE OF CORRECTION

| | | |
|---|---|---|
| PATENT NO. | : 7,038,958 B2 | Page 1 of 1 |
| APPLICATION NO. | : 10/926357 | |
| DATED | : May 2, 2006 | |
| INVENTOR(S) | : Yangsung Joo et al. | |

It is certified that error appears in the above-identified patent and that said Letters Patent is hereby corrected as shown below:

In the Specification, the following errors are corrected:

Column 5, lines 57-58, "coupled the" should read --coupled to the--;

Column 6, line 11, "include" should read --includes--;

Column 6, line 25, "also coupled" should read --also be coupled--;

Column 6, line 35, "an local" should read --a local--; and

Column 6, line 62, "system" should read --systems--.

Signed and Sealed this

Nineteenth Day of September, 2006

JON W. DUDAS
*Director of the United States Patent and Trademark Office*